United States Patent [19]

Takimoto et al.

[11] Patent Number: 4,882,216

[45] Date of Patent: Nov. 21, 1989

[54] EPOXY RESIN FILM COVERED WITH METAL FOIL AND FLEXIBLE PRINTED WIRING BOARD

[75] Inventors: Hideo Takimoto; Katsuji Tokuda; Koji Yamamoto, all of Kashima, Japan

[73] Assignee: Kashima Industries Co., Ibaraki, Japan

[21] Appl. No.: 230,310

[22] Filed: Aug. 9, 1988

[30] Foreign Application Priority Data

Aug. 10, 1987 [JP] Japan ................................ 62-198271
Oct. 29, 1987 [JP] Japan ................................ 62-271940

[51] Int. Cl.$^4$ ............................................... B32B 9/00
[52] U.S. Cl. ..................................... 428/209; 428/252; 428/285; 428/286; 428/418; 428/457; 428/901; 174/68.5; 361/397; 361/398; 525/505; 525/507; 525/523; 528/93; 528/109
[58] Field of Search ............... 361/397, 398; 174/68.5; 528/93, 109; 525/505, 507, 523; 428/209, 252, 285, 286, 418, 457, 901

[56] References Cited

U.S. PATENT DOCUMENTS

| 4,555,450 | 11/1985 | Uram, Jr. ............................ 525/505 |
| 4,663,401 | 5/1987 | Saito et al. ........................... 525/505 |
| 4,721,701 | 1/1988 | Stockinger et al. ................ 528/109 |
| 4,757,119 | 7/1988 | Wiggins et al. ..................... 528/109 |

FOREIGN PATENT DOCUMENTS 57-23295  2/1982  Japan.
58-40890  3/1983  Japan.
62-26147  2/1987  Japan.

OTHER PUBLICATIONS

Handbook of Epoxy Resins, Lee et al., McGraw Hill Book Co., 1967, pp. 16-21 to 16-30.

*Primary Examiner*—Ellis P. Robinson
*Assistant Examiner*—P. J. Ryan
*Attorney, Agent, or Firm*—Michael N. Meller

[57] ABSTRACT

A film comprising a metal foil and a flexible epoxy resin layer covered therewith, wherein the flexible epoxy resin layer is formed from a flexible epoxy resin composition containing one or more polythiol compounds as a hardener, and a flexible printed wiring board produced therefrom.

2 Claims, No Drawings

EPOXY RESIN FILM COVERED WITH METAL FOIL AND FLEXIBLE PRINTED WIRING BOARD

BACKGROUND OF THE INVENTION

1. Field of the Invention

The present invention relates to a film comprising a metal foil and a flexible epoxy resin layer covered therewith (hereinafter, referred to as "epoxy resin film covered with a metal foil", or "epoxy resin film"), and a flexible printed wiring board produced therefrom. The flexible printed wiring board according to the present invention can be used in electronic equipment, communications apparatus, household electric articles, office automation machines, motor vehicles, cameras, toys or the like. The epoxy resin film according to the present invention also may be used as a shield for a electromagnetic wave, or as a material for making toys.

2. Description of the Related Art

As a material used for a base film of a resin film covered with a metal foil, especially, a flexible printed wiring board, two kinds of films, i.e., polyimide film and a polyester film, are widely used, although a glass-epoxy base film is sometimes employed.

The polyimide film is very widely used for various applications as the base material of the flexible printed wiring board, due to an excellent heat-resistance against to soldering, but the polyimide film has the disadvantages of hygroscopicity and tearability and a very high cost, and thus the applications thereof are limited.

The polyester film has the problems of a poor heat-resistance and flame-retardance, although the other properties thereof are well balanced, but is relatively inexpensive. Therefore, the polyester film is widely used, when soldering is not required, or the requirement for the flame-retardance is not strict.

The glass-epoxy base film has a good heat-resistance and a low hygroscopicity, but the durability thereof under folding is poor, and therefore, the applications thereof are limited.

As explained above, the materials conventionally used as the base film of the resin film covered with the metal foil, particularly for the flexible printed wiring board, have several disadvantages. Namely, the polyimide film is expensive, easily absorbs moisture, and is easily torn; the polyester film has a poor heat-resistance and flame-retardance; and the glass-epoxy resin film has a poor folding durability.

SUMMARY OF THE INVENTION

Accordingly, the object of the present invention is to provide an epoxy resin film covered with a metal foil, which film has a good heat-resistance and low hygroscopicity stemming from the epoxy resin, and a good folding durability.

Another object of the present invention is to provide a flexible printed wiring board, having a good heat-resistance and low hygroscopicity stemming from the epoxy resin, and a good folding durability.

Other objects and advantages of the present invention will be apparent from the following description.

In accordance with the present invention, there is provided a film comprising a metal foil and a flexible epoxy resin layer covered therewith, characterized in that the flexible epoxy resin layer is formed from a flexible epoxy resin composition containing one or more polythiol compounds as a hardener.

Further, the present invention also relates to a flexible printed wiring board comprising a flexible epoxy resin substrate and a conductive wiring pattern, characterized in that the flexible epoxy resin substrate is formed from a flexible epoxy resin composition containing one or more polythiol compounds as a hardener.

DESCRIPTION OF THE PREFFERED EMBODIMENTS

The film according to the present invention, and the flexible printed wiring board, can include a heat-resistant fibrous cloth as a reinforcement material. As the hardener of a flexible epoxy resin composition, pentaerythritol tetrakis(mercaptopropionate) is most preferable.

As the metal foil which may be used for the production of the epoxy resin film covered with the metal foil, any metal can be used, so long as it can be produced in the form of a foil. Those metals which can be used in the present invention are, for example, copper, aluminium, nickel, tin, zinc, alloys of the above metals, and stainless steel.

Because the flexible printed wiring board of the present invention is produced from the epoxy resin film covered with the metal foil, the metal on the film must be electrically conductive. The conductive metals which may be used in the present invention is, for example, copper, silver, aluminium, nickel, tin, and zinc. As a copper foil, it is possible to use a copper foil prepared by electrolysis or rolling.

The thickness of the metal foil is not limited, but is generally 5 $\mu$m to 100 $\mu$m, preferably 15 $\mu$m to 70 $\mu$m. The kind of metal used and the thickness of the metal foil can be approximately determined in view of the applications of the epoxy resin film of the present invention.

A flexible epoxy resin composition is used to form a base of the epoxy resin film covered with the metal foil, thereby imparting basic characteristics such as flexibility, heat-resistance, low moisture-absorbability to the epoxy resin film, or the wiring board produced therefrom. The composition comprises one or more epoxy resins basic components, one or more polythiol components as the hardener, and one or more amine curing catalysts. The flexibility of the epoxy resin film is mainly imparted by the polythiol compound. Further, a brominated epoxy resin basic component may be used to impart a fire-retardance property to the film. Note, various organic and/or inorganic flame-retardant may be added for the same purpose.

As the epoxy resin basic component, known various compound (particularly, those commercially available) having various grades can be used. As examples of the epoxy resin basic component, there may be mentioned, a bisphenol A type epoxy resin basic component, such as a compound having the formula (1-1)

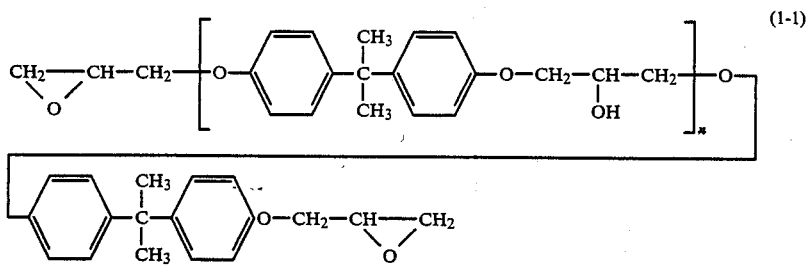 (1-1)

wherein n is 0 or a positive integer; a bisphenol F type epoxy resin basic component, such as a compound of the formula (1-2)

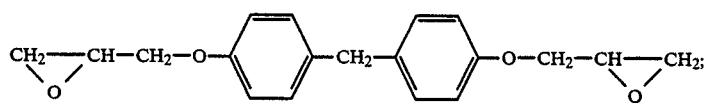 (1-2)

a novolak type epoxy resin basic component, such as a compound of the formula (1-3)

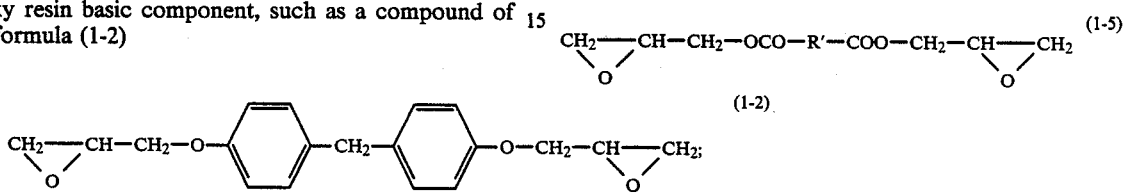 (1-3)

wherein n is 0 or an integer of 2 or less, and R represents a hydrogen atom or —$CH_3$; a brominated epoxy resin basic component, such as a compound of the formula (1-4)

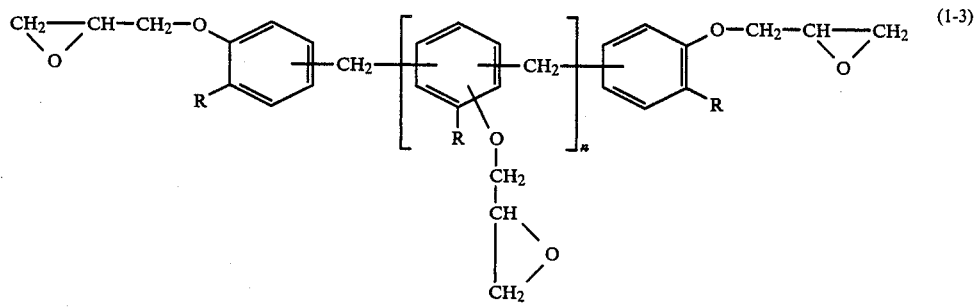 (1-4)

wherein n is an integer of 1 or more and m is 0 or a positive integer; a cyclic aliphatic epoxy resin basic component; a glycidyl ester type resin, such as a compound of the formula (1-5)

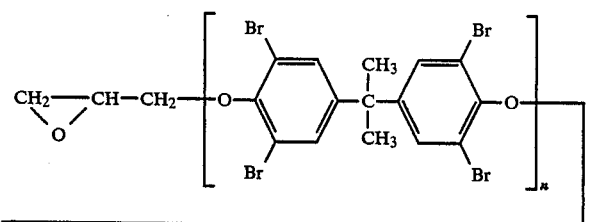 (1-5)

wherein R' represents

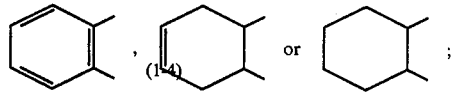

a diglycidyl p-oxybenzoic acid; a diglycidyl ester of dimer acid; a glycidylamine type epoxy resin basic component, such as compounds of the formulae (1-6), (1-7) and (1-8),

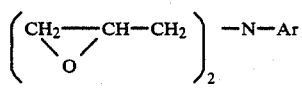

wherein Ar represents

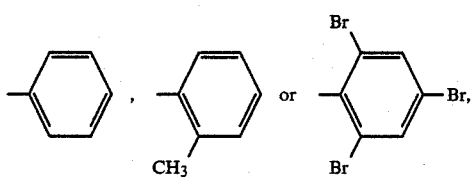

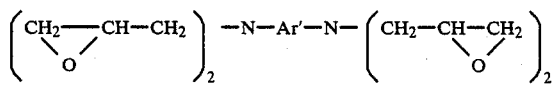

wherein Ar' represents

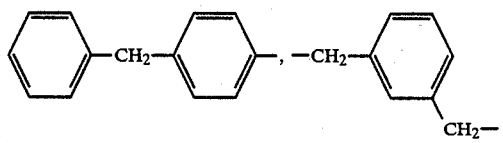

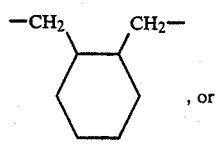

wherein Ar" represents

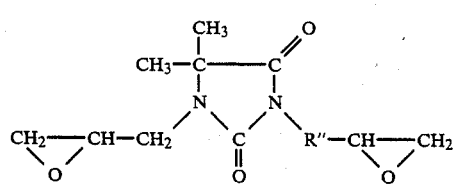

a hydantoin type epoxy resin basic component, such as a compound of the formula (1-9)

(1-9)

wherein R" represents $$-CH_2- \quad \text{or} \quad -CH-CH_2-O-CH_2-;$$
$$\quad\quad\quad\quad\quad\quad\quad\quad CH_3$$

a triglycidyl isocyanurate; a polypropyleneglycol diglycidyl ether, such as a compound of the formula (1-10)

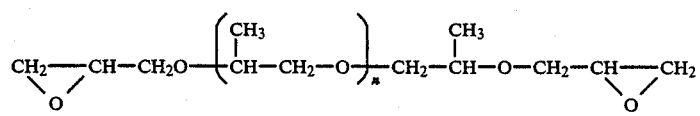

(1-10)

wherein n is a positive integer; a bisphenol S diglycidyl ether; a resorcinol diglycidyl ether; a hexahydrobisphenol A diglycidyl ether; a neopentylglycol diglycidyl ether; and a brominated novolak type epoxy resin basic component. The above epoxy resin basic component may be used singly or in combination, taking into account the purpose of use thereof. In view of the availability, cost, and properties of the cured epoxy resin, preferably the epoxy resin basic components of the bisphenol A type [formula (1-1)], bisphenol F type [formula (1-2)] and novolak type [formula (1-3)], brominated epoxy resin [formula (1-4)], polypropyleneglycol diglycidyl ether [formula (1-10)], and brominated novolak type epoxy resin basic component are used.

The polythiol compound which may be used in the present invention is an aliphatic or cycloaliphatic compound having two or more (preferably 2 to 4, more preferably 3 or 4 —SH groups).

The preferred polythiol compound is a linear, branched or cyclic aliphatic hydrocarbon compound having 6 or more carbon atoms and 2 or more (preferably 2–4) —SH groups (which one or more oxygen or sulfur atoms are interposed between), and substituted by one or more hydroxy or lower alkyl groups. As examples of the preferred polythiol compound, there may be mentioned a polyether polythiol, such as polyhydroxyethylene polythiol or polyhydroxypropylene polythiol, a cyclic ether polythiol such as trioxymethylene trithiol, and the like. The polyether polythiol compound is, for example, a compound of the formula (2-1)

$$R_1 \text{+} O\text{+}C_3H_6O\text{+}_n CH_2CH\text{—}CH_2SH]_m \quad (2\text{-}1)$$
$$\quad\quad\quad\quad\quad\quad\quad\quad\quad\quad\quad OH$$

wherein n is 0 or a positive integer, preferably 1–5, m is an integer of 2 or more, preferably 2–4, and $R_1$ represents an m-valent aliphatic group, such as a saturated aliphatic hydrocarbon group having m to m+3 carbon atoms, or polysulfide of the formula (2-2)

$$HS\text{+}C_2H_4OCH_2OC_2H_4\text{—}SS_n\text{+}C_2H_4OCH_2OC_2H_4\text{—}SH \quad (2\text{-}2)$$

wherein n is a positive integer, preferably 4–10.

Further, as the preferred polythiol compound, an ester of a mercaptocarboxylic acid, preferably mercapto-saturated aliphatic monocarboxylic acid (e.g., mercaptoacetic, mercaptopropionic, mercaptobutanoic, mercaptopentanoic or mercaptohexanoic acid) with a polyhydric alcohol, preferably a two to four valent alcohol (e.g., glycol, glycerol, trimethylolpropane, pentaerythritol or 1,2,3-trihydroxycyclohexane) may be used.

As the above ester, preferably a compound of the formula (2-3)

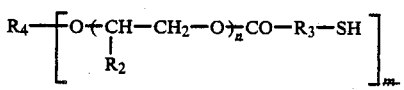

wherein $R_2$ represents a hydrogen atom or —$CH_3$, $R_3$ represents —$(CH_2)_l$—, l is an integer of 1-5, n is 0 or a positive integer, preferably 0-5, m is an integer of 2 or more, preferably 2-4, and $R_4$ represents an m-valent aliphatic group, such as a saturated aliphatic or cycloaliphatic hydrocarbon group having m to m+3 carbon atoms is used.

The above polythiol compound can be used singly or in combination. The polythiol compound generally has an infavorable odor. Thus, it is practically preferred to use the ester of the mercaptocarboxylic acid having little odor and the polyhydric alcohol. Examples of such esters are as follows: glycerol tris(mercaptoacetate), glycerol tris(mercaptopropionate), glycerol tris(mercaptobutyrate), glycerol tris(mercaptopentanoate), trimethylolpropane tris(mercaptoacetate), trimethylolpropane tris(mercaptobutyrate), trimethylolpropane tris(mercaptopentanoate), trimethylolpropane tris(mercaptohexanoate), pentaerythritol tetrakis(mercaptoacetate), pentaerythritol tetrakis(mercaptopropionate), pentaerythritol tetrakis(mercaptobutyrate), pentaerythritol tetrakis(mercaptopentanoate), pentaerythritol tetrakis(mercaptohexanoate), glycerol tris(polypropyleneglycol mercaptopropionate), or 1,2,3-trihydroxycyclohexane tris(polypropyleneglycol mercaptopropionate).

Of the polythiol compounds as the hardener, pentaerythritol tetrakis(mercaptopropionate) is most preferable, in view of the viscosity, odor, hardening property, cost and the like.

As the amine curing catalyst, polyamines, tertiary amines and imidazoles generally used as a curing agent for the epoxy resin may be employed singly or in combination. As examples of the polyamines, there may be mentioned aliphatic polyamine, polyamide polyamine, cycloaliphatic polyamine, aromatic polyamine, dicyandiamide and dihydrazide adipate. The tertiary amine is, for example, aliphatic, cycloaliphatic, heterocyclic or aromatic tertiary amine. As the imidazole, there may be mentioned, for example, a compound of the formula (3-1)

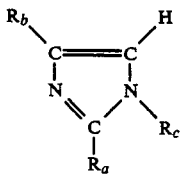

wherein $R_a$ represents —$CH_3$, —$C_2H_5$, —$C_{11}H_{23}$, —$C_{17}H_{35}$, or

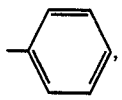

$R_b$ represents a hydrogen atom or —$CH_3$, and $R_c$ represents a hydrogen atom,

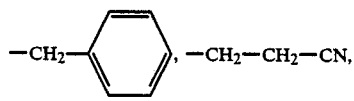

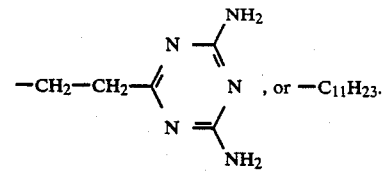

Of the compounds having the formula (3-1), compounds carrying substituents, $R_a$, $R_b$, and $R_c$ which are different from each other are widely used.

Into the flexible epoxy resin composition, any of various additives such as an anti-oxidizing agent, a modifier for moisture resistance, an agent for imparting adherence, a filler, a coupling agent, a solvent (reactive or inactive), a coloring agent, a dispersing agent, an anti-settling agent, or a thickener can be incorporated, in view of the purpose or application thereof or the like. The ratio of the components incorporated in the composition may be selected in view of the purpose or application thereof or the like. Typically, the composition comprising 10-150 parts by weight (preferably 20-100 parts by weight) of polythiol compound hardener and 0.01-20 parts by weight (preferably 0.05-15 parts by weight) of amine curing catalyst, with respect to 100 parts by weight of epoxy resin basic component, is used.

The heat-resistant fibrous cloth which may be used in the present invention is a woven or nonwoven cloth made, for example, of glass fiber, aromatic polyamide fiber, carbon fiber, ceramic fiber, or asbestos fiber. The cloth is used by laminating 1 to 5 (preferably 1 to 3) of the cloths, each having a thickness of 30-200 μm (preferably 30-100 μm) and impregnated with the epoxy resin composition.

The epoxy resin film covered with the metal foil according to the present invention can be produced by any known processes. Namely, a knife coater, spray coater, roll coater, blade coater, and spin coating may be used. For example, when a knife coater is employed, the flexible epoxy resin (uncured) composition liquid is coated to a uniform thickness by a knife edge on the metal foil running on backup rolls, and then cured in a heating oven, to obtain the film, which is subsequently rolled. The film produced in this process has, for example, a thickness of 55 μm-350 μm including a thickness (50 μm-250 μm) of the resin layer.

Alternatively, the epoxy resin film covered with the metal foil and containing the heat-resistance fibrous cloth may be produced by impregnating the heat-resistance fibrous cloth with the flexible epoxy resin (uncured) composition liquid, heat-rolling the impregnated cloth to adhere same to the metal foil, and curing the composition in the heating oven. The film produced in this process has, for example, a thickness of 85 μm -400 μm including a thickness (80 μm-300 μm) of the fiber-reinforcement resin layer.

The flexible printed wiring board according to the present invention may be produced by any known processes, from the epoxy resin film covered with the conductive metal foil according to the present invention.

For example, the printed wiring board can be produced, by a roll-to-roll manufacturing process, from the epoxy resin film covered with the conductive metal foil, by the steps of surface cleaning, drying, screen-printing, drying, etching, washing, drying, cover-lay-film laminating, punching, and cutting. Further, the printed wiring board can be produced by using a solder resist printing instead of the above cover-lay-film lamination.

The epoxy resin film covered with the metal foil according to the present invention can provide a flexible printed wiring board having a good folding durability, whereas the conventional board having the glass cloth-epoxy resin film base has a poor folding durability, and thus limited applications. Further, the printed wiring board of the present invention has a good heat-resistance, is less costly than the board of polyimide film, and does not exhibit the moisture-absorption that is the disadvantage of the board of the polyimide film, and thus the fields of utilization of the flexible printed wiring board can be increased. The wiring board of the present invention has a good heat-resistance, and thus can be employed in fields wherein the conventional board of the polyester film cannot be used.

The epoxy resin film covered with the metal foil according to the present invention can be used as the shield for the electromagnetic wave, in an electronic or electrical equipment, or as a wall material of a room, as a shield against radio waves.

Further, the epoxy resin film covered with the metal foil according to the present invention has a metallic gloss, and may be used as a decorative material for toys.

EXAMPLES

The present invention now will be further illustrated by, but is by no means limited to, the following Examples. In the following Examples, the term "parts" denotes parts by weight.

Example 1

A defoaming process was carried out while 100 parts of bisphenol A type epoxy resin (Epikote 828: Yuka Shell Epoxy K.K.) as the epoxy resin basic component, 61 parts of pentaerythritol tetrakis(mercaptopropionate) (hereinafter referred to as "PTMP") as the hardener, and 6.8 parts of m-xylylene diamine (hereinafter referred to as "MXDA") were mixed. The resulting epoxy resin uncured composition was uniformly coated by a knife coater on a rolled copper foil (Fukuda Kinzoku Hakufun Kogyo K.K.) having a thickness of 18 μm, and then used by heating at 120° C. for 60 minutes.

The resulting epoxy resin film covered with the copper foil to a total thickness of 150 μm was subjected to a folding durability test [JIS (Japanese Industrial Standard) P8115, MIT test, R = 1.5] and showed a folding endurance of 700 folds.

A comparative epoxy resin film covered with the copper foil was prepared by the same procedure as used in this Example, except that triethylenetetramine was used as the hardener, and exhibited a folding endurance of 200 folds.

The electromagnetic wave shielding effect of the epoxy resin film covered with the copper foil according to the present invention was determined by a TR-17301 of Takeda Riken Kogyo K.K. The film showed an attenuation factor of 60 dB or more at 20–800 MHz, and thus proved that the epoxy resin film covered with the copper foil of the present Example is useful as a shield against electromagnetic waves.

The flexible printed wiring board was produced from the epoxy resin film covered with the copper foil of this Example by the roll to roll process. The resulting board had a good dimensional accuracy of a wiring pattern thereof, and no dimensional change due to heating was observed after melt soldering. Further, little cracking occurred at a punching step for shape-processing and at a subsequent fabricating step, and therefore, the yield of acceptable products was high.

Example 2

The procedure described in Example 1 was repeated, except that a mixture of 80 parts of Epikote 828 and 20 parts of novolak type epoxy resin (Araldite ECN-1235; Ciba-Geigy Japan K.K.) was used as the epoxy resin basic component. The resulting epoxy resin film covered with the copper foil (total thickness: 180 μm) showed a folding endurance of 600 folds.

A flexible printed wiring board was produced from the resulting film of this Example, by the procedure of Example 1. The resulting board had a good dimensional accuracy of a wiring pattern thereof, and a good dimensional stability against heat. A punching step caused little cracking, and the yield of acceptable products was high in the subsequent fabrication step.

Example 3

The procedure described in Example 1 was repeated, except that, 100 parts of Araldite XPY306 (Ciba-Geigy Japan K.K.) was used as the epoxy resin basic component. The resulting epoxy resin film covered with the copper foil (total thickness: 120 μm) showed a folding endurance of 600 folds.

The flexible printed wiring board showing the good properties as obtained in Example 1 was produced from the resulting film of this Example 3, by the procedure of Example 1.

Example 4

The procedure described in Example 1 was repeated, except that a mixture of 60 parts of the brominated epoxy resin (Epikote 5050: Uka Shell Epoxy K.K.), 32 parts of propyleneglycol diglycidylether type epoxy resin (Araldite CY 221: Ciba-Geigy Japan K.K.), and 8 parts of bromine containing reactive diluting agent (Shellbroc: Yuka Shell Epoxy K.K.) was used as the epoxy resin basic component, and 36 parts of PTMP as the hardener and 3.0 parts of 2-methylimidazole as the curing agent were used. The resulting epoxy resin film covered with the copper foil (total thickness: 200 μm) showed a folding endurance of 900 folds.

After removing the copper foil from the epoxy resin film covered with the copper foil, a burning characteristic of the resin substrate was determined by UL94 to obtain V-0.

The flexible printed wiring board was produced by cutting the resulting epoxy resin film covered with the copper foil of this Example into a sheet. The working characteristics in each step (screen printing, etching, cover lay film lamination, punching, and cutting) were good, and the resulting board had a good dimensional accuracy of a wiring pattern thereon. The board also had excellent working characteristics for subsequent processes (e.g., plating, perforating, sheet reinforcing).

Example 5

The procedure described in Example 1 was repeated, except that 80 parts of polythiol compound (ATO-317M; Asahi Denka K.K.) which is a mixture of

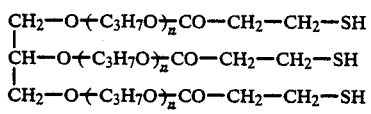

(n=ca. 0-3) and

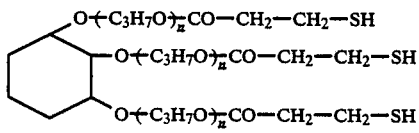

(n=ca. 0-3) was used as the hardener. The resulting epoxy resin film covered with the copper foil (total thickness: 150 μm) showed a folding endurance of 600 folds.

The flexible printed wiring board showing the good properties as obtained in Example 4 was produced from the resulting film of this Example 5, by the procedure of Example 4.

Examples 6-12 and Comparative Example 1-4

The epoxy resin compositions which comprise the epoxy resin basic components consisting of bisphenol A type epoxy resin (Epikote 828) and/or polypropyleneglycol diglycidylether type epoxy resin (Araldite CY-221), PTMP as the hardener, and 2-ethyl-4-methyl imidazole (hereinafter referred to as "EMIM") as the curing agent were coated by a roll coater to obtain epoxy resin films covered with the copper foils. The incorporating ratios and the film characteristics are listed in the following Table 1 as Examples 6-12. The comparative examples wherein amines were used as the hardener are also shown in Table 1.

It is apparent from Table 1 that the epoxy resin film covered with the copper foil according to the present invention has excellent film properties, and thus can be used for flexible printed wiring boards.

Flexible printed wiring boards were produced by cutting the resulting epoxy resin films covered with the copper foils of Examples 6-12 into sheets and carrying out the steps mentioned above. Each board had good working characteristics, a good dimensional accuracy of a wiring pattern thereon, and excellent working characteristics for subsequent processes.

TABLE 1

| | | Example | | | | | | | | Comparative Example | | | |
|---|---|---|---|---|---|---|---|---|---|---|---|---|---|
| | | 6 | 7 | 8 | 9 | 10 | 11 | 12 | 1 | 2 | 3 | 4 |
| Construction of film | Epikote 828 | 100 | 90 | 80 | 70 | 60 | 50 | — | 100 | 70 | 50 | — |
| | Araldite CY-221 | — | 10 | 20 | 30 | 40 | 50 | 100 | — | 30 | 50 | 100 |
| | PTMP[1] | 62.5 | 62 | 61 | 60 | 59 | 57.5 | 50 | — | — | — | — |
| | EMIM[2] | 0.1 | 0.1 | 0.1 | 0.1 | 0.1 | 0.1 | 0.1 | — | — | — | — |
| | Additive | — | Surfactant[5] 0.5 | Surfactant[5] 1.0 | Coupling agent[6] 0.5 | Coupling agent[6] 1.0 | — | — | TETA[3] 13 | Surfactant[5] 1.0 | Coupling agent[6] 1.0 | MXDA 13 |
| Properties of film having copper foil | Thickness of rolled copper foil (μm) | 18 | 35 | 18 | 35 | 18 | 18 | 18 | 18 | 35 | 18 | 35 |
| | Total thickness (μm) | 150 | 200 | 160 | 200 | 160 | 150 | 160 | 200 | 200 | 150 | 150 |
| | Peeling strength of copper foil at 180° (kg/cm) (JISC6744) | 1.60 | 1.50 | 1.55 | 1.55 | 1.50 | 1.45 | 1.40 | 1.05 | 0.90 | 0.80 | 0.75 |
| | Folding endurance (R = 1.5) (JISP8115) | 650 | 750 | 800 | 900 | 1,000 | 900 | 700 | 200 | 300 | 250 | 300 |
| | Surface resistivity (Ω · cm) (JISC6481) | $1.8 \times 10^{15}$ | $6.0 \times 10^{14}$ | $3.1 \times 10^{14}$ | $1.3 \times 10^{14}$ | $2.9 \times 10^{13}$ | $4.2 \times 10^{12}$ | $2.4 \times 10^{11}$ | $5.4 \times 10^{13}$ | $3.3 \times 10^{15}$ | $1.3 \times 10^{11}$ | $2.2 \times 10^{12}$ |
| | Volume resistivity (Ω · cm) (JISC6481) | $3.6 \times 10^{15}$ | $1.2 \times 10^{15}$ | $6.3 \times 10^{14}$ | $2.6 \times 10^{14}$ | $5.8 \times 10^{13}$ | $8.4 \times 10^{12}$ | $4.9 \times 10^{11}$ | $1.1 \times 10^{14}$ | $6.6 \times 10^{15}$ | $2.6 \times 10^{11}$ | $4.4 \times 10^{12}$ |
| | Resistance to soldering (260° C.) | 120 seconds | 60 seconds | 60 seconds | 60 seconds | 60 seconds | 30 seconds | 30 seconds | 60 seconds | 60 seconds | 30 seconds | 20 seconds |
| | | pass | pass | pass | pass | pass | pass | pass | pass | pass | pass | pass |
| | Resistance to plating | pass | pass | pass | pass | pass | pass | pass | pass | pass | pass | pass |

[1]PTMP ... pentaerythritol tetrakis (mercaptopropionate);
[2]EMIM ... 2-ethyl-4-methylimidazole;
[3]TETA ... trimethylenetetramine;
[4]MXDA ... m-xylylene diamine;
[5]Surfactant ... FC-430 (fluorinated type: 3M);
[6]Coupling agent ... A-187 (epoxysilane type: Nippon Unicar Co., Ltd.)
Note: Numerical figures listed in "construction of film" denote parts by weight, except for thickness.

(1): PTMT . . . pentaerythritol tetrakis (mercaptopropionate);
(2): EMIM . . . 2-ethyl-4-methylimidazole;
(3): TETA . . . trimethylenetetramine;
(4): MXDA . . . m-xylylene diamine;
(5): Surfactant . . . FC-430 (fluorinated type: 3M);
(6): Coupling agent . . . A-187 (epoxysilane type: Nippon Unicar Co., Ltd.)

Note: Numerical figures listed in "construction of film" denote parts by weight, except for thickness.

Example 13

The procedure described in Example 1 was repeated, except that 70 parts of polyether polythiol of the formula (2-1) (Capcure 3-800: Yuka Shell Epoxy K.K.) was used as the hardener. The resulting epoxy resin film covered with the copper foil (total thickness: 150 μm) showed a folding endurance of 600 folds.

The flexible printed wiring board showing the good properties as obtained in Example 1 was produced from the resulting film of this Example 13, by the procedure of Example 1.

Example 14

The procedure described in Example 1 was repeated, except that 100 parts of the compound of the formula

HS—(C$_2$H$_4$OCH$_2$OC$_2$H$_4$—SS)$_6$C$_2$H$_4$OCH$_2$OC$_2$H$_4$—SH (Thiokol LP-3: Toray Thiokol K.K.) was used as the hardener. The resulting epoxy resin film covered with the copper foil (thickness: 150 μm) showed a folding endurance of 600 folds.

The flexible printed wiring board showing the good properties as obtained in Example 1 was produced from the resulting film of this Example 14, by the procedure of Example 1.

Example 15

A defoaming procedure was carried out while a mixture of 60 parts of Epikote 828 and 40 parts of Araldite CY-221 as the epoxy resin basic component, 59 parts of PTMP as the hardener, and 0.1 part of EMIM were mixed. Three pieces of plain weave glass cloth (each thickness: 35 μm) (Unichika, Ltd.; weight: 26 g/m$^2$) were impregnated with the resulting epoxy resin uncured composition, laminated one upon the other, rolled on a copper foil having a thickness of 18 μm, and then cured by heating at 120° C. for 60 minutes in an oven. The resulting film having a total thickness of 210 μm showed a folding endurance of 500 folds. The tensile strength thereof was 1,500 kg/cm$^2$, whereas a tensile strength of the film without glass cloth was 250 kg/cm$^2$.

Although the film including the glass cloth had an inferior folding durability compared to that of the film without the glass cloth, the mechanical strength, and thus the working characteristic, were improved.

The flexible printed wiring board showing the good properties as obtained in Example 1 was produced from the resulting film of this Example 15, by the procedure of Example 1.

Example 16

The procedure described in Example 1 was repeated, except that a stainless steel foil with a thickness of 50 μm (SUS304: Fukuda Kinzoku Hakufun Kogyo K.K.) was used as the metal foil.

The resulting film had a total thickness of 200 μm and about one third the weight of a stainless steel plate with the same thickness, and was flexible. Therefore, this film is very useful as a decorative material for toys.

Although the present invention has been described with reference to specific embodiments, various changes and modifications obvious to those skilled in the art are deemed to be within the spirit, scope and concept of the invention.

We claim:

1. A film comprising an electrically conductive metal foil and a flexible epoxy resin layer covered therewith, characterized in that the flexible epoxy resin layer is formed from a flexible epoxy resin composition containing 100 parts by weight of epoxy resins, 10 to 150 parts by weight of an ester of a mercaptocarboxylic acid with a polyhydric alcohol, and 0.01 to 20 parts by weight of amine.

2. A flexible printed wiring board comprising a flexible epoxy resin substrate and a conductive wiring pattern, characterized in that the flexible epoxy resin substrate is formed from a flexible epoxy resin composition containing 100 parts by weight of epoxy resins, 10 to 150 parts by weight of an ester of a mercaptocarboxylic acid with a polyhydric alcohol, and 0.01 to 20 parts by weight of amine.

* * * * *